United States Patent [19]

Fooks et al.

[11] Patent Number: 5,281,810
[45] Date of Patent: Jan. 25, 1994

[54] PHOTOELECTRIC CONTROL UNIT ADAPTED FOR DETERMINING ITS OWN OPERATING MARGIN HAVING DUAL VARIABLE-GAIN AMPLIFIER

[75] Inventors: Elik I. Fooks; Patrick J. Delaney, III, both of Middlesex County; Philip E. Johnson, Worcester County, all of Mass.

[73] Assignee: Allen-Bradley Company, Inc., Milwaukee, Wis.

[21] Appl. No.: 998,976

[22] Filed: Dec. 30, 1992

[51] Int. Cl.$^5$ .............................................. G01V 9/04
[52] U.S. Cl. .............................. 250/222.1; 250/214 A; 340/556
[58] Field of Search ................ 250/222.1, 221, 214 A, 250/214 AG; 340/555, 556, 557; 307/311

[56] References Cited

U.S. PATENT DOCUMENTS 4,906,832  3/1990  Beeckel ........................... 250/214 A
5,008,531  4/1991  Ono et al. ........................... 250/221

*Primary Examiner*—David C. Nelms
*Assistant Examiner*—Que T. Le
*Attorney, Agent, or Firm*—John J. Horn; H. Frederick Hamann

[57] ABSTRACT

A photoelectric control unit including an electronic system having a system architecture which is adapted for allowing the unit to readily and accurately determine its own operating margin. This architecture system includes a pair of variable gain modules which operate in conjunction with a pair of separate signal channels. The signal channels have comparators for comparing signal amplitudes on their respective channels with a common reference level. Operating margin values are determined by varying the gain of the amplification modules and tracking the output from the comparators on the signal channels. The photoelectric control unit can then use operating margin values to automatically set the system gain and thereby adjust the sensitivity of the unit for optimum performance.

12 Claims, 10 Drawing Sheets

FIG. 4 ELECTRONIC SYSTEM

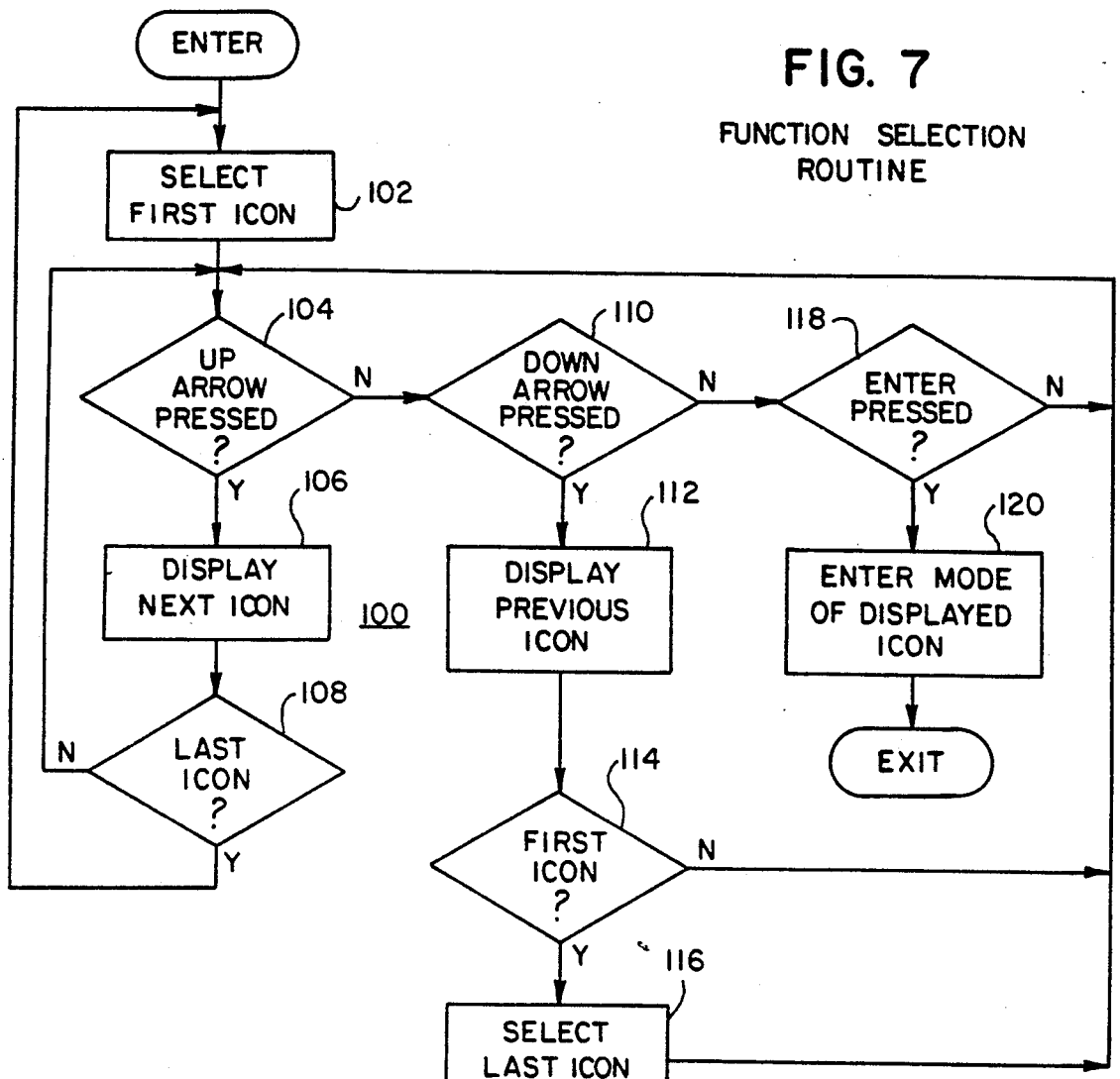
FIG. 7
FUNCTION SELECTION ROUTINE
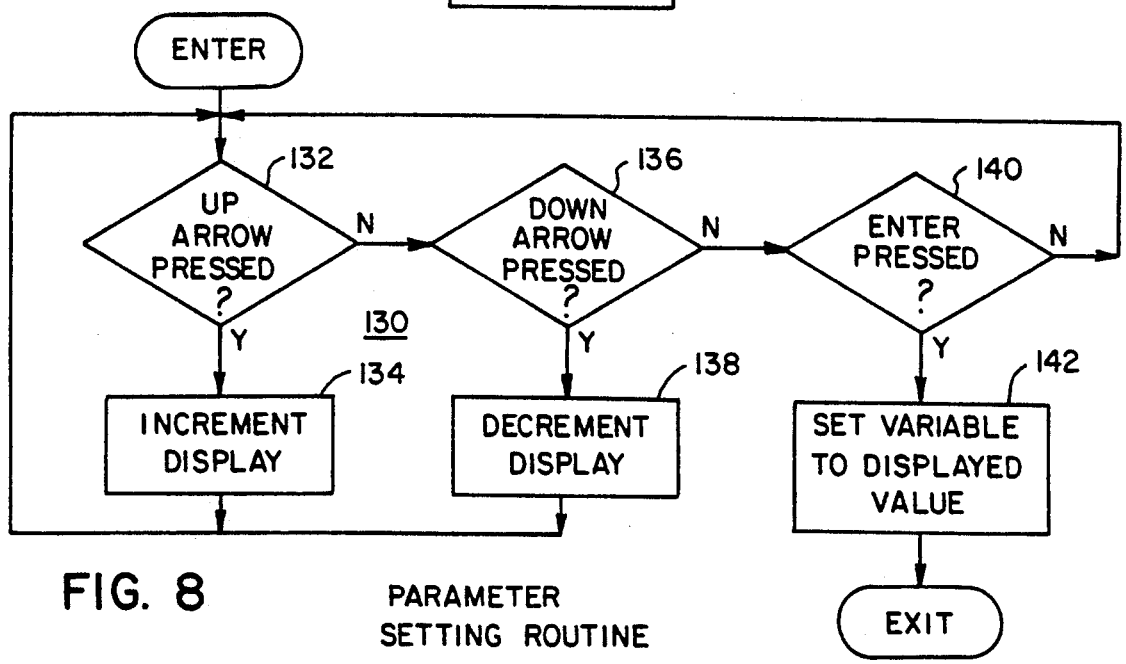
FIG. 8  PARAMETER SETTING ROUTINE

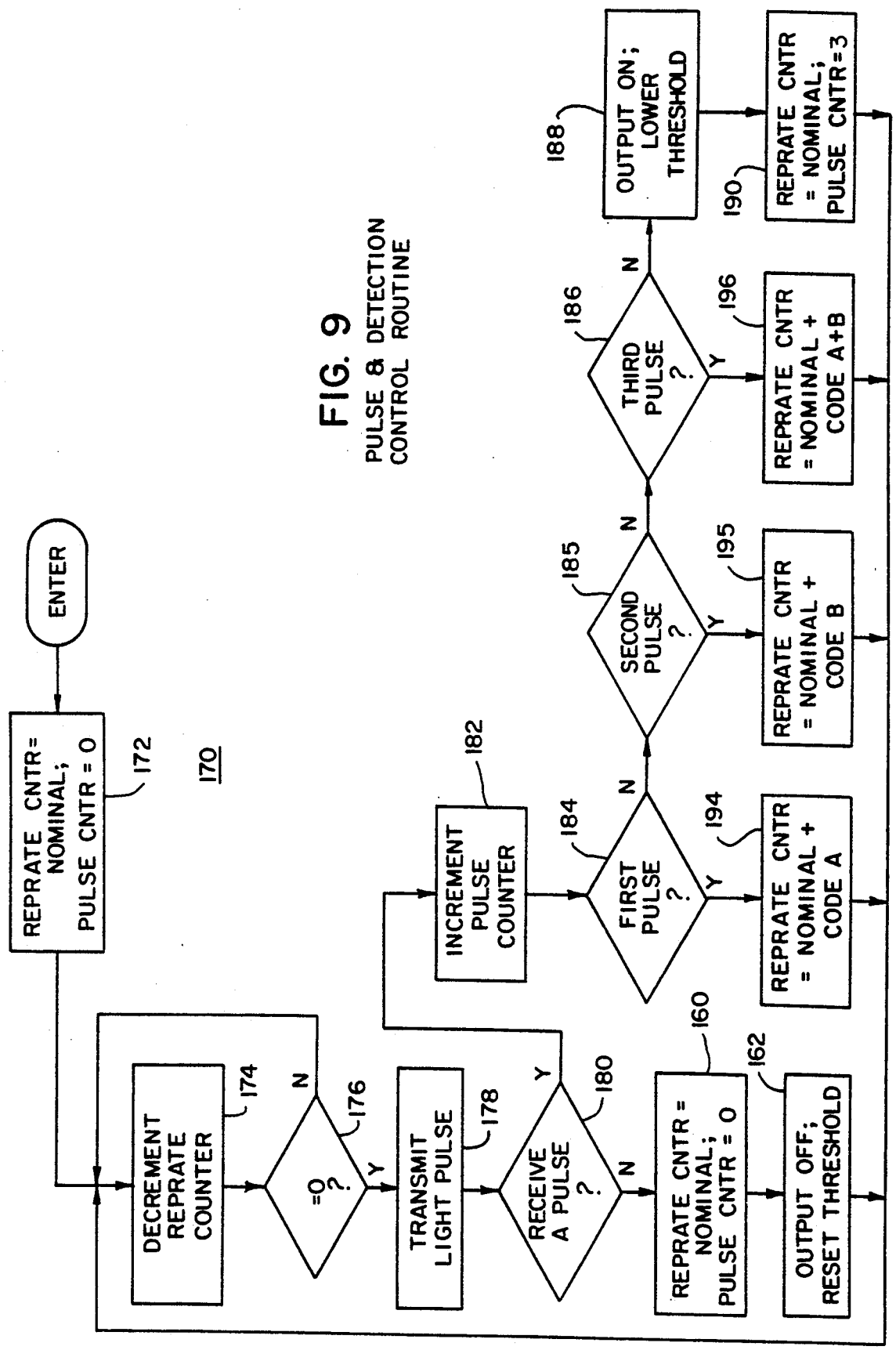

MARGIN ROUTINE

LEARN AGS ROUTINE

AGS BACKGROUND ROUTINE

AGS TARGET ROUTINE

3-D SURFACE MESH FOR MARGIN & NOISE INPUT - STABILITY OUTPUT

PHOTOELECTRIC CONTROL UNIT ADAPTED FOR DETERMINING ITS OWN OPERATING MARGIN HAVING DUAL VARIABLE-GAIN AMPLIFIER

BACKGROUND OF THE INVENTION

The present invention relates to photoelectric detectors and more particularly to photoelectric control units which periodically transmit light pulses and synchronously detect return pulses.

In the past photoelectric control units have been manufactured in a range of models each of which is suitable for a particular type of application environment. Furthermore, photoelectric control units have not been designed to provide the operator with much in the way of useful information about the unit's current settings or the conditions under which it is operating. Consequently, photoelectric control units have not had much flexibility for being used in different types of applications and have not been able to provide much information of the type the operator might, for example, use to align the unit. While some photoelectric control units have been designed to operate under microprocessor control these units have nevertheless not been designed to be especially user friendly or to offer the operator a wide range of operational settings suitable for different applications. Furthermore, most photoelectric control units have been susceptible to giving false signals due to electrical and optical noise occurring at the same frequency as the pulse repetition rate of the control unit itself. Such noise may be due to other photoelectric control units in the vicinity or simply due to other machinery having comparable operating frequencies. Nevertheless, when the noise is on frequency with the pulse repetition rate, ordinary pulse counting and synchronous detection techniques are not able to eliminate the noise problem. Additionally, most traditional photoelectric control units have not provided accurate measures of operating margin or reliable indications of overall operational stability. Operating margin has ordinarily been difficult to determine on account of the narrow voltage ranges over which most photoelectric control units operate and the difficulties with amplifier saturation which occur when such voltage ranges are exceeded. Satisfactory systems have not been developed for allowing a photoelectric control unit to determine its own operating margin in an accurate fashion over a broad range. Furthermore, even given measures of operating margin, the operational stability of a photoelectric control unit has been difficult to determine. Photoelectric control units can be affected by high noise levels in their operating environment which can degrade operational stability despite satisfactory levels of operating margin.

It is therefore an object of the present invention to provide a photoelectric control unit having a user friendly operator interface which allows for operator control over a wide range of operational settings in a convenient and understandable fashion so that the unit can be adapted for use in a large number of different applications.

It is another object of the present invention to provide a photoelectric control unit having a target acquisition system which is immune to electrical and optical noise occurring on frequency with the repetition rate of the photoelectric control unit itself.

It is a further object of the present invention to provide a photoelectric control unit which is capable of accurately measuring its own operating margin over a broad range of signal levels and providing a reliable indication of its operational stability as a function of operating margin and noise.

It is yet another object of the present invention to provide a photoelectric control unit in which the pulse repetition rate and operating range of the unit may be selected by the operator at the operating site through the use of a user friendly interface.

It is yet a further object of the present invention to provide a photoelectric control unit which is flexible in operation, provides useful information feedback to its operator, is otherwise reliable in operation and can be produced at a reasonable cost.

SUMMARY OF THE INVENTION

The present invention constitutes a photoelectric control unit adapted for periodically transmitting light pulses and synchronously detecting return pulses having a special system architecture including variable gain modules for determining operating margin, an operator interface having multiple functions for enabling operator control over the units electronic system, a target acquisition system having special pulse timing features for reliably acquiring target objects despite on frequency background interference and a system for providing an indication of the operational stability of the unit as a function of both operating margin and noise.

The system architecture includes two signal channels each of which receives and amplifies the output from the system photodetector and includes a comparator for separately comparing the signal levels on both channels with a common reference level. However, the second signal channel includes a variable gain module which allows the gain on this channel to be adjusted to assume any of a number of different values. Operating margin is determined by adjusting the gain on the second signal channel until the comparator installed on this channel switches state and comparing the gain level at which this occurs with the gain level at which the first signal channel is operating. In the preferred embodiment, a variable gain module in also installed in the signal path leading from the photodetector to both signal channels for decreasing or throttling down the main gain level and increasing the range over which operating margins can be determined. Further, the preferred embodiment includes a system for automatically setting system sensitivity for optimum performance using measures of operating margin under background and target conditions.

The operator interface includes a plurality of display icons each of which corresponds to one or more control functions. These icons are displayed in conjunction with the selection and operation of the control functions. The interface also includes a numerical display for displaying numerical values in conjunction with icons and for assisting in the selection of control parameters. Furthermore, in the preferred embodiment, the numerical display is operative for displaying operating margin as an aide in mechanical alignment of the photoelectrical control unit. Additionally, the operator interface allows the user to select one of a number of light pulse repetition rates and thereby automatically adjust the speed and conversely the range of the unit in accordance with the requirements of its operating environment.

In order to help overcome background noise problems light pulses which are transmitted during the target acquisition process are subject to pseudo-random jitter factors. These jitter factors change the interpulse timing intervals between selected light pulses. By varying the timing between pulses immunity is provided to electrical and optical noise which may be on frequency with the normal pulse repetition rate. The jitter technique may be applied to various algorithms in which different patterns of sequential pulse reception constitute criteria for target detection. For example, if four consecutive return pulses must be received to indicate the presence of a target, after the first return pulse is detected the next (i.e. second, third and fourth) light pulses to be transmitted are delayed by pseudo-random type factors in order to avoid noise occurring at the normal pulse repetition rate frequency pursuant to the synchronous detection process.

The operational stability of the photoelectric control unit is determined by measuring photoelectric operating margin and measuring background noise and generating an operational stability figure as a function of both of these quantities. In the preferred embodiment, operating margin is generated using the dual channel system architecture and noise is measured by counting the noise pulses occurring during interpulse periods. Stability figures are determined in accordance with fuzzy logic membership functions of operating margin and background noise and fuzzy logic rules relating stability to photoelectric operating margin and background noise. This fuzzy logic technique allows operational stability figures to reflect empirical experience in order to thereby provide a better indication of stability conditions in accordance with real world experience.

BRIEF DESCRIPTION OF THE DRAWINGS

FIG. 7 provides a flow chart illustrating the function selection process associated with the operator interface of the present invention.

FIG. 8 provides a flow chart illustrating the parameter setting process associated with the operator interface of the present invention.

FIG. 9 provides a flow chart of the target acquisition process in accordance with the principles of the present invention whereby jitter is used to vary interpulse intervals.

DESCRIPTION OF THE PREFERRED EMBODIMENT

Figure 1:
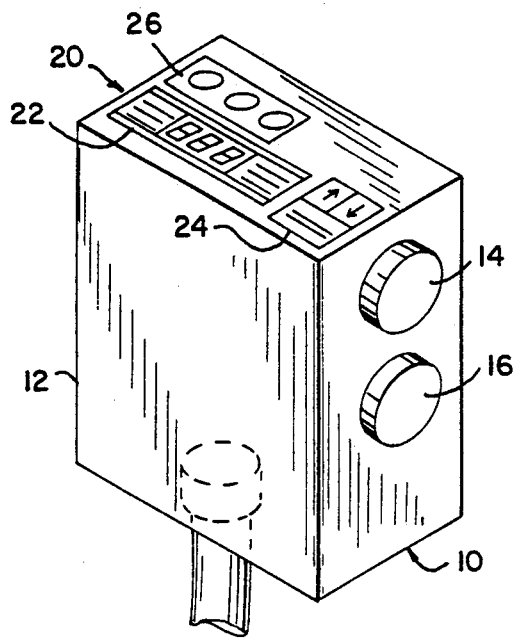
FIG. 1 provides an elevated prospective view of a photoelectric control unit showing an operator interface on the top surface of the unit.

Referring now to FIG. 1, a photoelectric control unit 10 is shown having a housing 12 for containing electrical and optical components and a pair of lenses 14 and 16 for directing optical output and collecting optical input. The photoelectric control unit 10 also includes an operator interface panel 20 having an informational display 22 and an input keypad 24.

Figure 2:
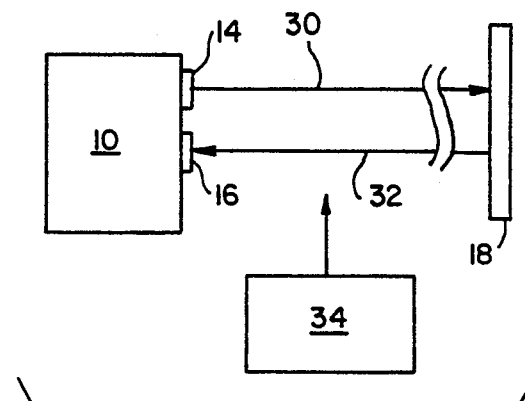
FIG. 2 provides a block diagram illustrating the operation of a photoelectric control unit in a retroreflective mode.

Referring now to FIG. 2, the photoelectric control unit 10 can be configured for transmitting a lightbeam 30 of light pulses out from the lens 14 to a reflector 18 which directs a lightbeam of reflected light pulses 32 to the lens 16 for synchronous detection of the return pulses by the electronic components of the unit 10. The lightbeams 30 and 32 define an optical path between the photoelectric control unit 10 and the reflector 18. When a target object 34 to be detected passes between the photoelectric control unit 10 and the reflector 18 this optical path is broken and the control unit senses the presence of the object 24 and generates an output signal indicative of the presence of the target object. It should, however, be understood that the photoelectric control unit 10 can operate in a number of different configurations such as the "retroreflective" configuration described above or, for example, by "through beam" detection or by "diffuse proximity" sensing of light reflected off of objects to be detected.

Figure 3:
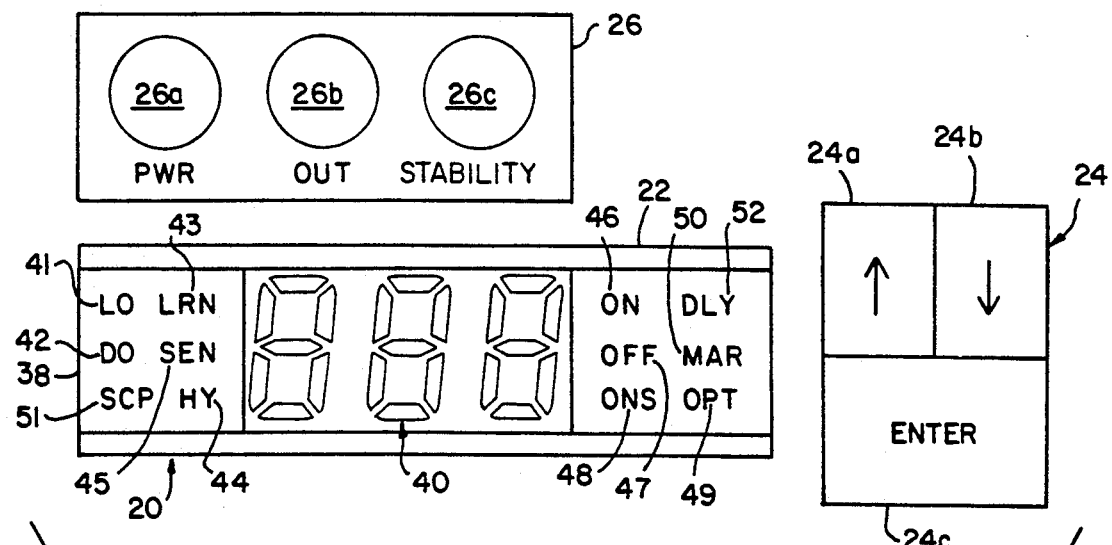
FIG. 3 provides a plan view of the operator interface of the present invention for use in conjunction with a photoelectric control unit.

Referring now to FIG. 3, the operator interface panel 20 is shown as including a transreflective TNFE liquid crystal display 22 featuring a three-digit numerical display 40 and twelve display icons 41-52 providing a graphical style interface for displaying control information. The display 22 may also include an LED for providing backlighting. A keypad 24 includes three separate input keys 24a, 24b and 24c corresponding to up, down and enter actions respectively. A display 26 includes three separate LEDs 26A, 26B and 26C which indicate when power is applied to the control unit 10, when the control unit 10 is providing output and when a special photoelectric stability figure for the control unit 10 (which will be described in greater detail with respect to FIG. 14) is greater than a fixed threshold, respectively. The icons 41-52 operate in conjunction with the keys 24a-24c to allow the operator to readily select a number of different control options associated with the photoelectric control unit 10. The icons 41-52 and their corresponding operational functions and menu categories are described in the Icon Description Table below:

LO/DO, LRN, HY, ON/DLY, OFF/DLY, ONS/DLY, OPT AND MAR icons 45, 41/42, 43, 44,

ICON DESCRIPTION TABLE

| ICON | CORRESPONDING FUNCTION | MENU CATEGORY |
|---|---|---|
| LO | LIGHT OPERATE MODE | SET UP MODE-OUTPUT ON WHEN PHOTODETECTOR SEES LIGHT |
| DO | DARK OPERATE MODE | SET UP MODE-OUTPUT OFF WHEN PHOTODETECTOR SEES LIGHT |
| LRN | LEARN-AUTOMATIC GAIN SETTING | AUTOMATIC PARAMETER-GAIN LEVEL |
| HY | HYSTERESIS SETTING | SET UP PARAMETER-AMOUNT OF HYSTERESIS |
| SEN | SENSITIVITY SETTING | SET UP PARAMETER-GAIN LEVEL (MANUAL) |
| ON | ON DELAY MODE (used with "DLY") | SET UP PARAMETER AND MODE-ON OUTPUT TIMING DELAY |
| OFF | OFF DELAY MODE (used with "DLY") | SET UP PARAMETER AND MODE-OFF OUTPUT TIMING DELAY |
| ONS | ONE SHOT TIMING MODE | SET UP PARAMETER AND MODE-ONE SHOT OUTPUT TIMING |
| OPT | OPTION MODE AND SETTINGS | SET UP PARAMETER-PULSE REPETITION RATE |
| MAR | MARGIN DISPLAY | OPERATIONAL DISPLAY IDENTIFIER |
| SCP | SHORT CIRCUIT PROTECTION | DIAGNOSTIC INDICATOR, BLINKS TO INDICATE EXCESSIVE OUTPUT CURRENT HAS TRIGGERED SCP |
| DLY | DELAY (ON OR OFF) MODE | SET UP MODE AND PARAMETER-OUTPUT TIMING FUNCTIONS |

The icons 41-52 and their corresponding operations in providing visual messages during both "run and "program" modes are described in the Icon Operation Table below:

46/52, 47/52, 48/52, 49 and 50, respectively, as the arrow keys 24a and 24b are pressed. When the enter key 24c is pressed the function corresponding to the illuminated icon will be entered for selection of different

ICON OPERATION TABLE

| ICON | RUN MODE | PROGRAM MODE |
|---|---|---|
| LO | ALWAYS ACTIVE WHEN LIGHT OPERATE MODE IS SELECTED | ACTIVE IN MAIN MENU CYCLE AFTER SEN WHEN DARK OPERATE MODE IS SELECTED |
| ICON | RUN FUNCTION | PROGRAM OPERATION |
| DO | ALWAYS ACTIVE WHEN IN DARK OPERATE MODE IS SELECTED | ACTIVE IN MAIN MENU CYCLE AFTER SEN WHEN LIGHT OPERATE MODE IS SELECTED |
| LRN | ACTIVE AFTER LRN UNTIL SENSITIVITY FUNCTION ACTIVATED | ACTIVE DURING LEARN FUNCTION IN MAIN MENU CYCLE |
| HY | ACTIVE WHEN SMALL HYSTERESIS IS SELECTED | ACTIVE DURING HYSTERESIS SETTING FUNCTION IN MAIN MENU CYCLE |
| SEN | INACTIVE | ACTIVE DURING SENSITIVITY SETTING FUNCTION IN MAIN MENU CYCLE |
| ON | ACTIVE IF NON-ZERO ON DELAY IS SELECTED | ACTIVE DURING "DLY" FUNCTION IN MAIN MENU CYCLE |
| OFF | ACTIVE IF NON-ZERO OFF DELAY IS SELECTED | ACTIVE DURING "DLY" FUNCTION IN MAIN MENU CYCLE |
| ONS | ACTIVE IS NON-ZERO ONS (ONE SHOT) DELAY IS SELECTED | ACTIVE DURING "DLY" FUNCTION IN MAIN MENU CYCLE |
| OPT | INACTIVE | ACTIVE DURING "OPT" FUNCTION IN MAIN MENU CYCLE |
| MAR | ALWAYS ACTIVE | ACTIVE TO SIGNAL MENU EXIT (TO RUN MODE) |
| SCP | FLASHES WHENEVER THE SHORT CIRCUIT PROTECTION FEATURE ENGAGES | FLASHES WHENEVER THE SHORT CIRCUIT PROTECTION FEATURE ENGAGES |
| DLY | ACTIVE IF ON, OFF, OR ONS DELAY ARE NON-ZERO | ACTIVE DURING ON, OFF AND/OR ONS DELAY FUNCTIONS |

Whenever the photoelectric control unit 10 is in the "program mode" after the enter key 24c is initially pressed the icons 41-52 correspond to two nested levels of menu items. The top level cycles between the SEN, types of mode or parameter settings. Pressing the arrow keys 24a and 24b advances the menu system to the next or previous menu item leaving the setting or mode unchanged or at its default value. Alternatively, when specific functions are completed, the menu system automatically advances to the next indicated menu item unless otherwise configured.

More specifically, when the sensitivity setting function corresponding to the SEN icon 45 is entered the numerical display 40 is activated for showing a main gain level setting for the amplification system associated with the pulse detection electronics of the unit 10 on an arbitrary 1-250 scale. The arrow keys 24a and 24b may then be used to manually set a new gain level for the pulse detection amplification system. The gain value displayed on the display 40 is selected for use as the new gain level when the enter key 24c is again pressed.

When the light or dark operate selection function corresponding to the LO/DO icons 41 and 42 is entered the unit 10 toggles between opposite modes of operation as the enter key 24c is pressed. If the photoelectric control unit 10 is in the light operate mode and the enter key 24c is pressed, it toggles to the dark operate mode of operation and, conversely, if the photoelectric control unit 10 is in the dark operate mode of operation and the enter key 24c is pressed, it toggles to the light operate mode of operation. Whenever the light operate mode is selected the DO icon 42 is displayed. Whenever the dark operate mode is selected the LO icon 41 is displayed.

When the learn function is entered corresponding to the LRN icon 43 the control unit 10 "learns" both the "no light" condition and "light" condition and then automatically sets a gain setting associated with the pulse detection amplification system for optimum system sensitivity as will be described in greater detail with respect to FIGS. 11A and 11B. It should be noted that the learn function is independent of the user selection of either light operate or dark operate modes. The "no light" condition must be presented to the photoelectric control unit 10 first and therefore the sensor is initially presented with whatever is intended to produce the off state in the light operate mode and whatever is intended to produce the on state in the dark operate mode. At the end of the learn function the photoelectric control unit 10 reverts to the run mode with the numerical margin displayed and the MAR icon 50 illuminated. The LRN icon 43 remains displayed until such time as the gain setting learned during the learn function is manually changed pursuant the sensitivity setting function.

When the hysteresis function corresponding to the HY icon 44 is entered the system toggles between a large hysteresis amount (e.g. 20%) and a small hysteresis amount (e.g. 5%) as the enter key 24c is pressed. During the setting selection process the numerical display 40 shows either "hi" or "lo" symbols indicating the targeted selection. Whenever a small amount of hysteresis is selected the HY icon 44 is illuminated to indicate that the system is operating at the small hysteresis setting.

When the output time delay settings function is entered corresponding to the DLY icon 52 the display 20 indicates a currently selected or default delay type (On Delay, Off Delay or One Shot) by illumination of the icons ON, OFF or ONS 46, 47 or 48 while the numerical display 40 indicates a time delay setting. The arrow keys 24a and 24b may be used to change the delay function which may then be selected by pressing the enter key 24c. The arrow keys 24a and 24b then control the numerical display 40 for cycling through the different amounts of time delay. A particular delay time value may be selected by pressing the enter key 24c. The process of delay time selection pursuant to the delay function continues until all of the delay items have either been acted upon or passed by.

When the option function corresponding to the OPT icon 49 is entered the numerical display 40 indicates a currently selected or default light pulse repetition rate. The arrow keys 24a and 24b may be used to control the numerical display 40 for cycling through different numerals (1, 2 or 3) representing different repetition rates at which the unit 10 can operate. A particular repetition rate may be selected by pressing the enter key 24c.

It should be noted that the photoelectric control unit 10 is operationally active with respect to transmitting and detecting light pulses and providing output except during the learn and option functions. Furthermore, the photoelectric control unit 10 automatically reverts to the "run mode" and illuminates the MAR icon 50 after 6 seconds of keypad inactivity except in the Learn function during which a longer period of inactivity such as 45 seconds inactivity is required to revert to the run mode. Whenever the unit 10 is in the run mode with the MAR icon 50 displayed a margin determination function corresponding to the routine 200 of FIGS. 10A and 10B is active whereby the numerical display 40 indicates the current operating margin on a 0.2-96 scale which allows the unit 10 to be mechanically aligned for optimum detection results.

Figure 4:
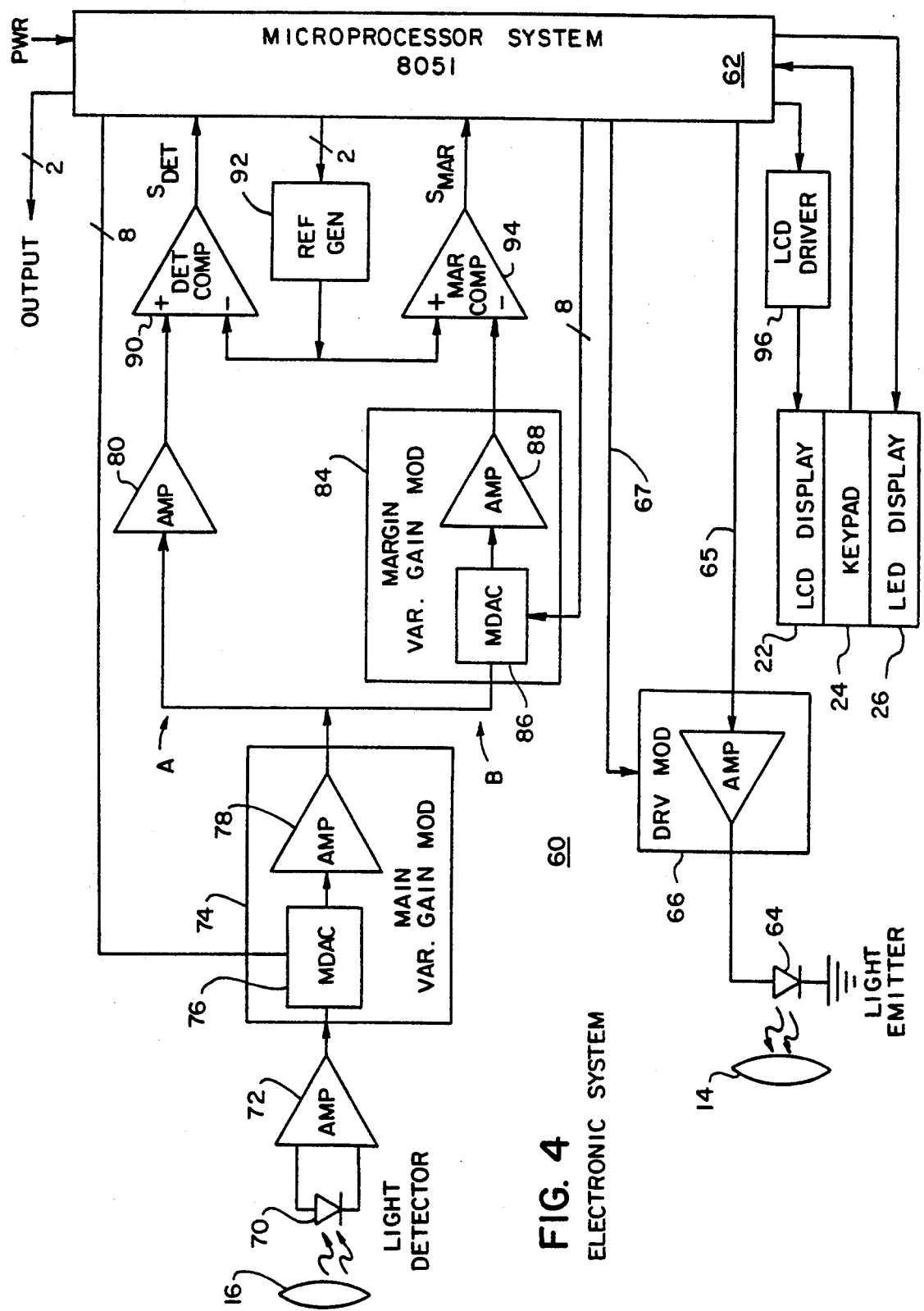
FIG. 4 provides a block diagram of an electronic system for use in a photoelectric control unit in accordance with the principles of the present invention.

Referring now to FIG. 4, the electronic system 60 of the photoelectric control unit 10 of the present invention includes a microprocessor system 62 for executing a software program which regulates the overall operation of the unit 10. The system 60 also includes an LED 64 which emits periodically timed light pulses which are collimated by the lens 14 for output from the unit 10. The light pulses are produced in response to pulses of current supplied to the LED 64 from the current driver module 66 which operates under control of the microprocessor system 62. The light emitted by the diode 64 and returned to the unit 10 may be focused by the lens 16 as it is received for pickup by the photo diode 70. The microprocessor system 62 regulates both the repetition rate and amplitude level of the current and resulting light pulses in response to the operator selecting a particular repetition rate pursuant to the option function corresponding to the OPT icon 49 in accordance with the Repetition Rate Table shown below:

| REP RATE | REPETITION RATE TABLE | | PEAK CURRENT |
| --- | --- | --- | --- |
| | NOMINAL FREQUENCY | NOMINAL RESPONSE TIME | |
| 1 | 1000 HERTZ | 4 mS. | 1.0 A |
| 2 | 2500 HERTZ | 1.6 mS | 500 mA. |
| 3 | 5000 HERTZ | 0.8 mS | 250 mA. |

Figure 5:
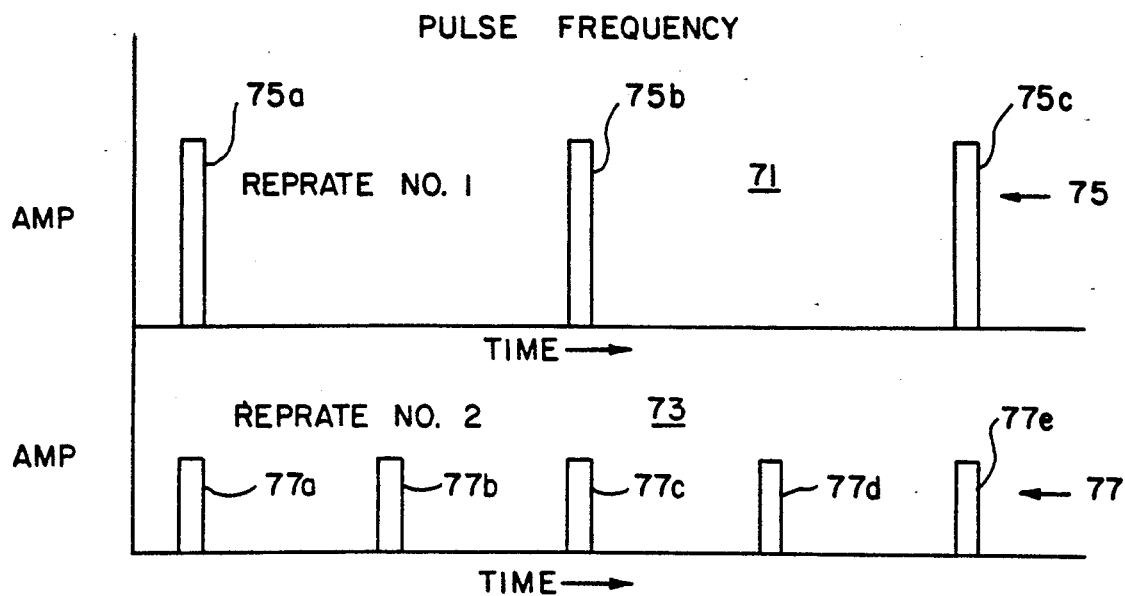
FIG. 5 provides a pair of graphs illustrating different pulse repetition rates which may be selected for operation of a photoelectric control unit in accordance with principles of the present invention.

The repetition rate is controlled by designation of the nominal value for the Reprate counter used in the control routine 170 of FIG. 9 which regulates the time intervals between pulse control signals supplied to the module 66 on line 65. The gain of the driver module 66 is regulated by control signals on lines 67 in order to control the level of pulse current. The peak current must be controlled in coordination with pulse repetition rate to, among other things, avoid overloading the LED 64 as a result of increases in duty cycle. It should be noted that a natural trade off exists between system response time and detection range. As the repetition rate increases response time improves but range is reduced. The photoelectric control unit 10 allows the user the flexibility to select the most suitable repetition rate for his particular response time and range needs. FIG. 5 shows graphs 71 and 73 of pulse trains 75 and 77 at repetition rates 1 and 2, respectively. The pulses 75a-c and 77a-e have the same pulse duration, however, the pulses 77a-e have one-half the amplitude and occur at two and one-half times the rate.

The photodiode 70 is connected to a fixed gain transimpedance amplifier 72 which provides low impedance on its input and converts the current signal of the photodiode 70 to a voltage signal which is then supplied to a main variable gain module 74. The main variable gain module 74 includes a multiplying digital-to-analog converter 76 which provides variable attenuation in response to control signals from the microprocessor system 62 and a fixed gain amplifier 78 which provides a further amount of signal gain. The output of the main variable gain module 74 is separately provided along a first channel A to a fixed gain amplifier 80 and along a second channel B to a margin variable gain module 84.

The fixed gain amplifier 80 provides output to a detection comparator 90 which compares the amplitude of the output of the amplifier 80 with the amplitude of a reference level supplied from a reference generator 92 under control of the microprocessor system 62. The detection comparator 90 produces the main light pulse detection signal SDET which is supplied to the microprocessor system 62 as an indication of reflected light received by the unit 10 corresponding to light pulses emitted by the LED 64.

The reference generator 92 is controlled by the microprocessor system 62 to provide an output having four reference levels defining the small and large amounts of hysteresis which may be selected by the system operator in accordance with the hysteresis setting function. The margin variable gain module 84 includes a multiplying digital-to-analog converter 86 which provides variable attenuation in response to control signals from the microprocessor system 62 and a fixed gain amplifier 88. The margin variable gain module 84 provides an output to the margin comparator 94 which compares the amplitude of this signal with the amplitude of the reference signal supplied from the reference generator 92. The margin comparator 94 provides a margin signal $S_{MAR}$ to the microprocessor system 62 which is useful in determining operating margin levels.

Channel A (including the amplifier 80 and detection comparator 90), Channel B (including the margin variable gain module 84 and the margin comparator 94) and the main variable gain module 74 provide an architecture which can be regulated by the microprocessor 62 under software control for identifying operating margin levels over a broad range of values and then automatically setting the gain of the system 74 for optimum detection results. The operation of the system 60 in identifying operating margin levels and automatically setting gain values will be further described with respect to FIGS. 11A, 11B, 12 and 13. The system 60 also includes the electronic components associated with the display 22, the keypad 24 and the LED display 26. The display 22 is driven by a LCD driver 96 for displaying output from a microprocessor system 62 in accordance with the icons, numerals and associated functions previously described. The keypad 24 provides input to the microprocessor system 62 in coordination with the icons displayed by the LCD display and their associated functions. The LED display 26 supplies visual outputs from the microprocessor system 62 indicating basic operational characteristics as previously described.

Referring now to FIG. 7, a routine 100 is shown for the highest level of menu control associated with the operation of the LCD display 22, the icons 41-52 and the keypad 24 whereby functions associated with the icons 41-52 may be entered for selecting operational modes and parameter settings. In the first step 102 the SEN icon 45 is displayed and its corresponding function targeted for a possible entry. Thereafter, the program 100 includes steps 104, 106, 108, 110, 112, 114 and 116 whereby the icons SEN 45, LO/DO 41 and 42, LRN 43, HY 45, DLY 52 and OPT 49 can be sequentially displayed and their corresponding functions targeted for possible entry in response to the up arrow key 24a being repetitively pressed or (in reverse order) the down arrow key 24b being repetitively pressed. As each icon is displayed the program queries whether the enter key 24c has been pressed pursuant to step 118 and directs entry into the corresponding function in accordance with step 120 whenever the enter key 24c is pressed.

Referring now to FIG. 8, the program 130 includes steps 132, 134, 136 and 138 whereby values shown on the numerical display 40 can be incremented and decremented by fixed amounts in response to the up arrow key 24a being pressed in step 132 or the down arrow key 24b being pressed in step 136. Simultaneously, the steps 140 and 142 of the program 130 provide that the displayed value of any variable can be designated for functional implementation in response to the enter key 24c being pressed.

Figure 6:
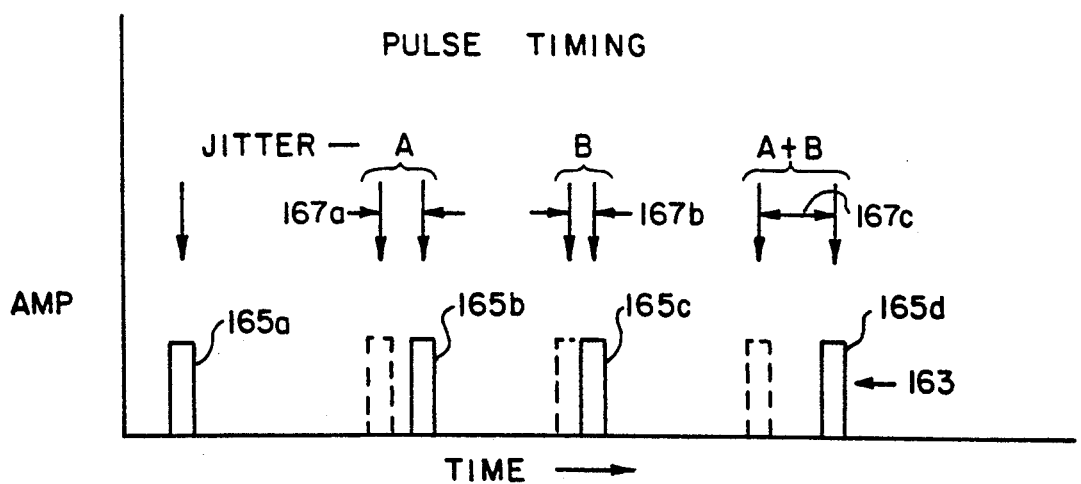
FIG. 6 provides a graph illustrating how pseudo-random jitter may affect pulse timing in accordance with the principles of the present invention.

Referring now to FIG. 9, the pulse and detection control routine 170 governing the operation of the photoelectric control unit 10 in transmitting light pulses, synchronously detecting response pulses and indicating when a target is acquired is shown. In accordance with the first step 172 a Reprate counter is set to a nominal value such as 500 while a pulse counter is set to zero value. The program then proceeds to step 174 in which the Reprate counter is decremented by a single number to provide a new Reprate value. Thereafter, in step 176 the program queries whether the Reprate counter is now equal to zero. If the Reprate counter is not equal to zero, the program jumps back to step 174 whereby the counter is again decremented. If, on the other hand the Reprate counter is now equal to zero, the program then proceeds to step 178 whereby it transmits a single light pulse. It should be noted that computation time can be conserved if the Reprate Counter of steps 174 and 176 is implemented in hardware by using a counter associated with the microprocessor of the system 62. In step 180 the program then queries whether a response pulse of reflected light has been (synchronously) received within the transmission period. If a return light pulse has been received, the program passes to step 182 in which the pulse counter is incremented by a single number to provide a new pulse count value. Steps 184, 185 and 186 operate in conjunction with each other for directing different pulse count events to steps 194, 195 and 196, respectively, depending on the number of consecutive pulses that have been counted. If only one consecutive pulse has been received the program is channelled to step 194. If two consecutive pulses have been received the program is channeled to step 195. If three consecutive pulses have been received the program is channeled to step 196. Steps 194, 195 and 196 set the reprate counter to three different values whereby the "dwell" interval between light pulses is controlled to "jitter" so as to avoid interference between nearby photoelectric control units and other on-frequency devices. In step 194 the Reprate counter is set to the nominal value plus a smaller psuedo-random code A value. In step 195 the reprate counter is set to the nominal value plus a smaller and different psuedo-random code B value. In step 196 the reprate counter is set to the nominal value plus the sum of the psuedo-random code A and B values. Following steps 194, 195 and 196 the program jumps back to step 174 to execute the loop defined by steps 174 and 176 which determines the duration of the time interval between light pulses. Since the Reprate counter is set to different values in steps 194, 195 and 196, the loop comprised of steps 174 and 176 takes correspondingly different amounts of time to be executed which results in light pulses being transmitted at slightly different and non-standard intervals at step 178. Whenever a fourth consecutive light pulse is received the program passes through steps 184, 185 and 186 to step 188 whereby the output is turned on and the detection threshold is lowered in accordance with the hysteresis value setting. Thereafter, in step 190 the reprate counter is again set to its nominal value while the pulse counter is set to a value of three to insure that step 188 is reached whenever further consecutive pulses are received. Returning now to step 180, if a return light pulse is not received, the program is directed to step 160 in which the reprate counter is again set to its nominal value while the pulse counter is set to zero value. Thereafter, in step 162 the output is turned off (if it had been previously turned on) and the detection threshold is reset (if it had been previously lowered) in accordance with the hysteresis setting. After step 162 the program jumps back to step 174 for completion of another standard "dwell" interval and the transmission of another light pulse in accordance with step 178. The routine 170 controls the output of the photoelectric control unit 10 so that targets can only be acquired after repetitive and consecutive light pulse responses have been received. Furthermore, the routine 170 shifts the intervals between light pulses in accordance with random codes which can be set to different values for different control units at the factory in order to provide different jitter factors which help insure that nearby photoelectric control units do not interfere with each other. FIG. 6 shows a graph 161 of a pulse train 163 during successful target acquisition over four consecutive pulses 165a–d. Pulse 165b is time delayed by a random code A jitter factor 167a. Pulse 165c is time delayed by a random code B jitter factor 167b. Pulse 165d is time delayed by a random code A+B jitter factor 167c. The time delay factors 167a–c provide a type of aperiodic timing which when combined with the synchronous detection technique used in the unit 10 avoids interference from other nearby photoelectric control units transmitting pulses at similar repetition rates and other sources of on frequency noise.

Figure 10:
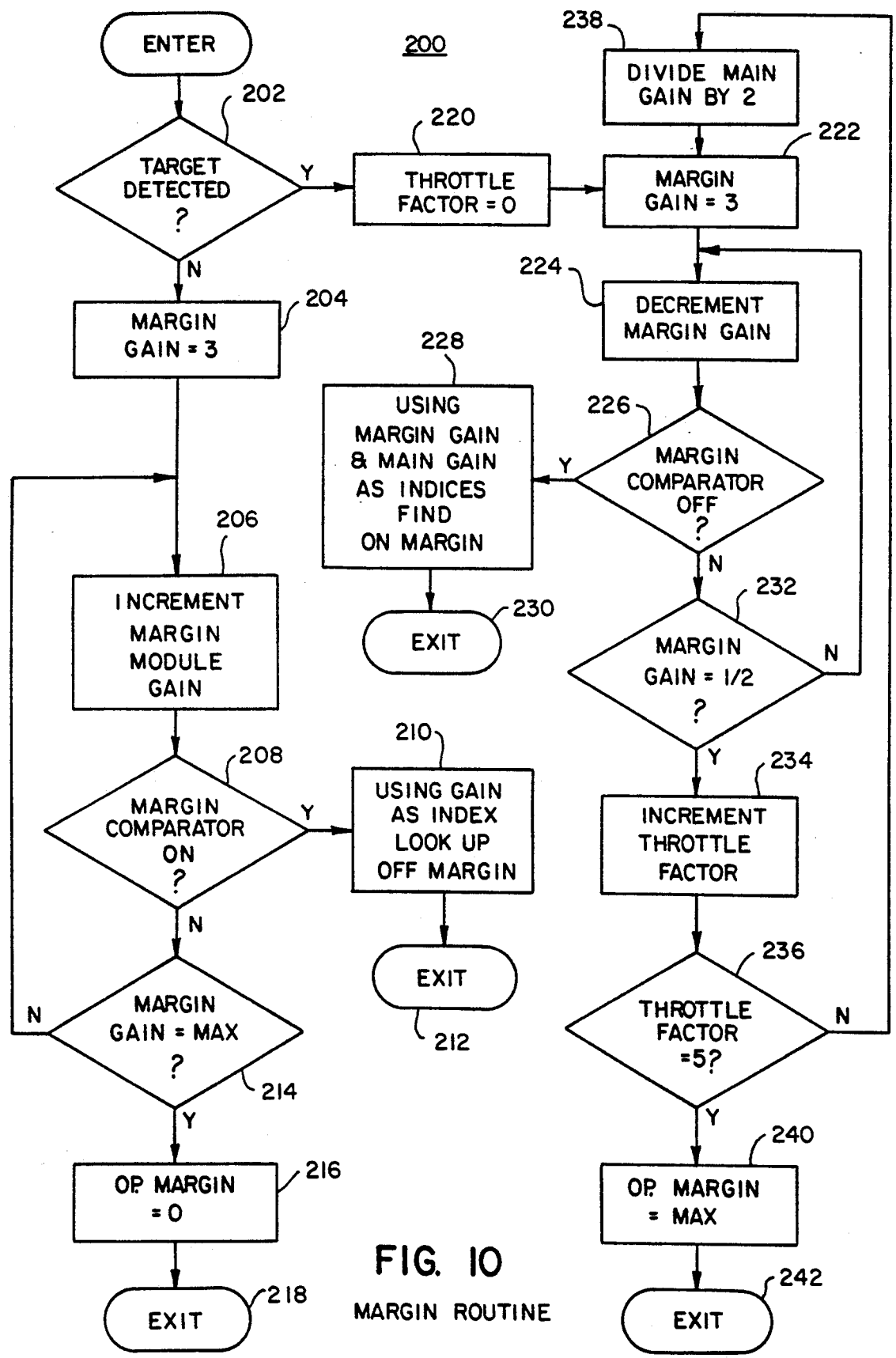
FIG. 10 provides a flow chart of the process for determining operating margin in accordance with the dual channel architecture of the present invention.

Referring now to FIG. 10, the margin routine 200 is operative for detecting the operating margin of the photoelectric control unit 10 by manipulating the gains of the variable gain modules 74 and 84 and following the output of the margin comparator 94. In step 202 the program queries whether the object at which the photoelectric control unit 10 is targeted is being detected as indicated by the output $S_{DET}$ of the detection comparator 90 in order to make a branching decision.

If the target is not detected, the gain of the margin variable gain module 84 (the "gain margin") is set to three in accordance with step 204 by adjusting the attenuation of the multiplying digital-to-analog converter 86. The program then proceeds to step 206 in which the gain of the module 84 is incremented by an amount that varies in accordance with gain level to provide a linear scale for margins of less than 1 as shown in the Gain Margin Table below:

| GAIN MARGIN TABLE | |
|---|---|
| OFF Margin-Gain | ON Margin-Gain |
| .2–15x | 1.0–3.0x |
| .3–10x | 1.1–2.727x |
| .4–7.5x | 1.2–2.50x |
| .5–6.0x | 1.3–2.308x |
| .6–5.0x | 1.4–2.143x |
| .7–4.286x | 1.5–2.0x |
| .8–3.75x | 1.6–1.875x |
| 1.0–3.0x | 1.7–1.765x |
| | 1.8–1.667x |
| | 1.9–1.579x |
| | 2.0–1.50x |
| | 2.5–1.2x |
| | 3.0–1.0x |
| | 3.5–0.857x |
| | 4.0–0.75x |
| | 5.0–0.60x |
| | 6.0–0.50x |

In step 208 the program queries whether the margin comparator 94 is on as indicated by its output signal $S_{MAR}$. If the margin comparator 94 is on, the program is directed to step 210 in which it uses the current value of the gain margin as an indice to look up a value for the operating margin. The program can then terminate in accordance with block 212.

If, on the other hand the margin comparator 94 is not on, the program then queries whether the gain margin is at its maximum level in accordance with step 214 in order to make a branching decision. If the gain of the margin module 84 is not at maximum level, the program jumps back to step 206. If, on the other hand, the gain of the margin module 84 is at its maximum level, the program sets the operating margin value to zero in step 216 and terminates in accordance with block 218. The steps 206, 208 and 214 establish a loop by means of which the gain margin is increased step by step until the margin comparator 94 is turned on. The gain level for the margin variable gain module 84 required to turn the margin comparator 94 on provides a reference for determining the operating margin of the photoelectric control unit 10.

Returning now to step 202, if a target object is detected, the program proceeds to steps 220 and 222 in which a "throttle factor" counter is set to zero and the gain margin is set to three by adjusting the attenuation of the multiplying digital-to-analog converter 86. The throttle factor corresponds to the gain level of the main variable gain module 74 (the "main gain") which is adjustable in accordance with step 238 at five levels which are related as shown in Throttle Margin Table below:

| THROTTLE MARGIN TABLE | |
|---|---|
| THROTTLE FACTOR | MAIN GAIN |
| 0 | user setting |
| 1 | user setting/2 |
| 2 | user setting/4 |
| 3 | user setting/8 |
| 4 | user setting/16 |

Thereafter, the program proceeds to step 224 in which the gain of the module 84 is decremented by an amount that varies in accordance with gain level to provide a nonlinear scale as shown in the Gain Margin Table. In step 226 the program queries whether the margin comparator 94 is off as indicated by its output signal $S_{MAR}$. If the margin comparator 94 is off, the program is directed to step 228 in which it uses the current value of the gain margin and the current value of the throttle factor to look up a value for the operating margin. The program then terminates in accordance with block 230.

If, on the other hand the margin comparator 94 is on, the program then queries whether the gain margin is equal to one-half in order to prevent the gain from being reduced to the point where saturation conditions may affect the amplifiers in the system 60. If the gain margin is not equal to one-half, the program jumps back to step 224 whereby the gain margin is again decremented. If, on the other hand the gain margin is equal to one-half, the program passes to step 234 in which it increments the throttle factor corresponding to different levels of main gain. Thereafter, in step 236 the program queries whether the throttle factor is now equal to five in order to make a branching decision. If the throttle factor is not equal to five, the program proceeds to step 238 in which the gain of the main variable gain module 74 is reduced to one-half its current level by adjusting the attenuation of the multiplying digital-to-analog converter 76. The program then passes back to step 222 and subsequent steps whereby the gain level of the margin variable module 84 is manipulated in three steps corresponding to the last three ON margin steps of the Gain Margin Table in an attempt to again get the margin comparator 94 to turn off. However, if in step 236 the throttle factor is determined to be equal to five, the program sets the value of the operating margin to its maximum level in step 240 and terminates in accordance with step 242.

Steps 234, 236 and 238 provide a first loop for throttling down the main gain of the system 60 through five levels to avoid saturation effects which may be affecting the system amplifiers while steps 222, 224, 226 and 232 provide a second loop for reducing the gain margin step by step until the margin comparator turns off. The levels of the main gain (or the throttle factor) and the gain margin can then be used as indices for looking up a value for the operating margin of the photoelectric control unit 10.

Figure 11:
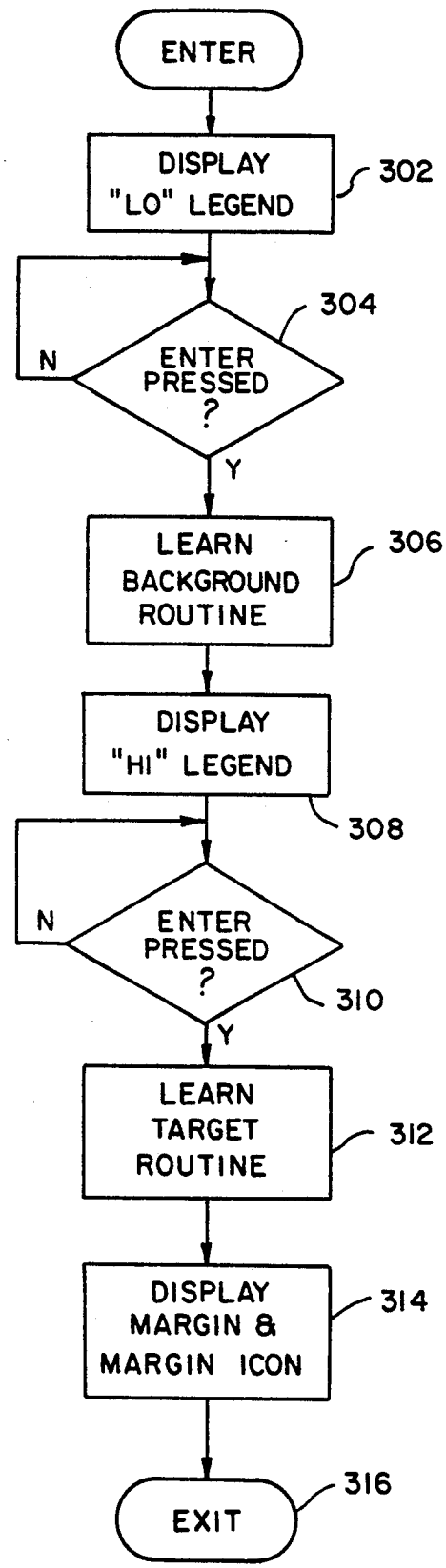
FIG. 11 provides a flow chart of the process for automatically determining a gain setting for a photoelectric control unit in accordance with the principles of the present invention.
Figure 12:
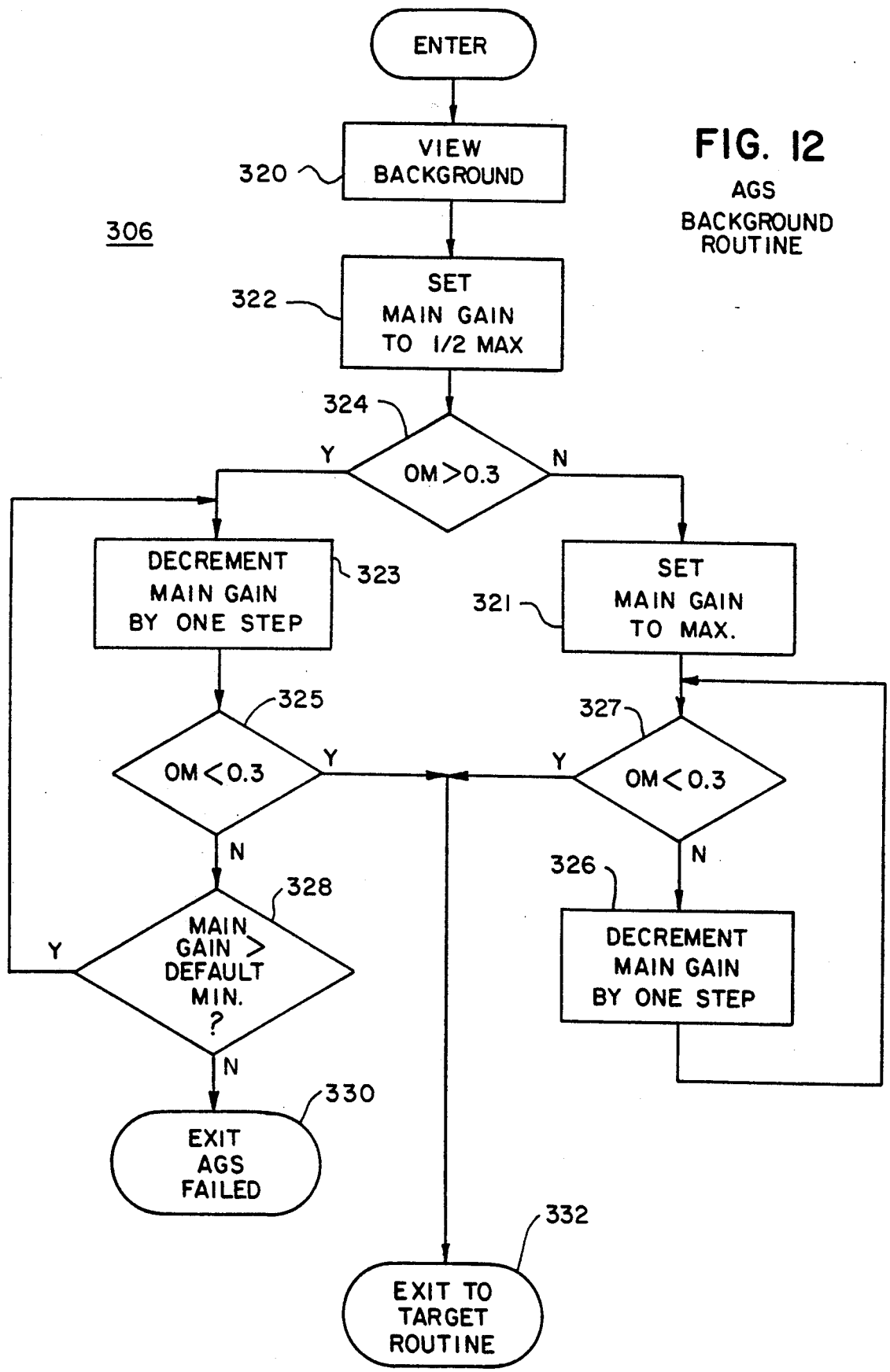
FIG. 12 provides a flow chart of the process for determining the operating margin under background conditions for use in the automatic gain setting routine of the present invention.
Figure 13:
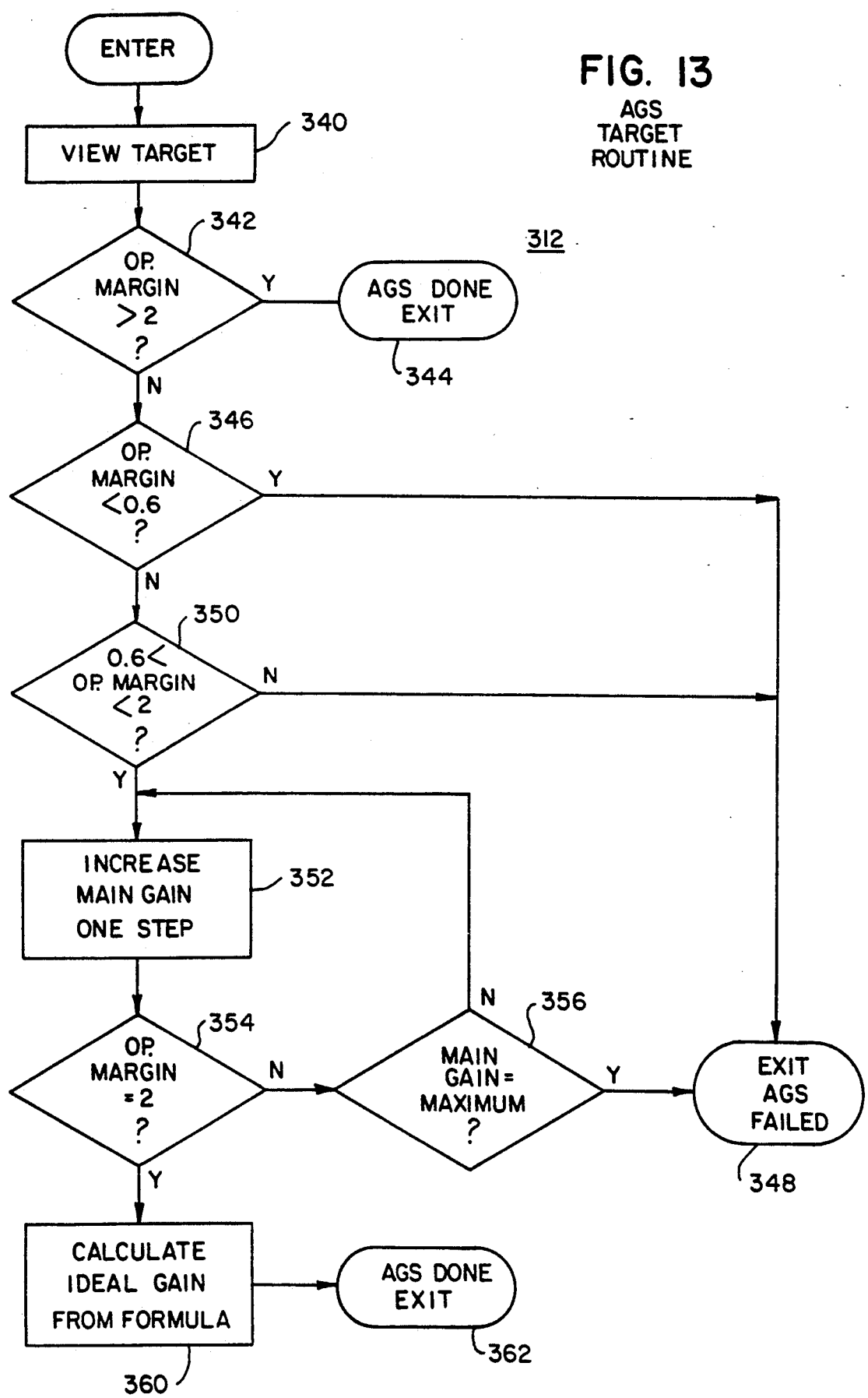
FIG. 13 provides a flow chart of the process for determining operating margin under target conditions for use in the automatic gain setting routine of the present invention.

Referring now to FIG. 11, the automatic gain setting routine 300 provides the learn function corresponding to the LRN icon 43 and enables the photoelectric control unit 10 to view background conditions, view the target conditions and determine an optimum main gain setting for the system 60 to insure reliable target detection. In the first step 302, the LO legend is displayed. Thereafter, in step 304 the program queries whether the enter key 24c has been pressed as an indication that the control unit 10 is properly configured for executing the learn background routine 306. The routine 306 is shown in FIG. 12 and provides for manipulation of the main gain of the control unit 10 to achieve an operating margin of less than 0.3 under background conditions. The program then passes to step 308 in which the HI legend is displayed. Thereafter, in step 310 the program queries whether the enter key 24c has been pressed as an indication that the photoelectric control unit 10 is properly configured for execution of the learn target routine 312. The routine 312 is shown in FIG. 13 and provides for manipulation of the main gain of the system 60 to provide the optimum setting under target conditions. The program proceeds to step 314 in which the operating margin is displayed on the numerical display 40 and the margin icon 38 is illuminated in accordance with normal run mode operating conditions as the routine 300 is terminated in accordance with block 316.

Referring now to FIG. 12, the learn background routine 306 begins with the photoelectric unit arranged for viewing the background as indicated by step 320. In accordance with step 322 the main gain (of the variable gain module 74) is then set to one-half of its maximum level by adjusting the attenuation of the converter 76. The program then passes to step 324 in which it computes the operating margin pursuant to routine 200 and queries whether it is greater than 0.3 in order to make a branching decision. If the operating margin is greater than 0.3, the program is directed to step 323 in which the main gain is decremented by one (counter) step. The program then proceeds to step 325 in which it computes a new operating margin pursuant to routine 200 and queries whether the operating margin is now less than 0.3 in order to make another branching decision. If the operating margin is not less than 0.3, the program is directed to step 328. In step 328 the program queries whether the main gain is still greater than a default minimum necessary for proper operation of the photoelectric control unit 10. If the main gain is greater than the default minimum, the program jumps back to step 323 but otherwise the routine 306 terminates at block 330. Returning to step 325, if the operating margin is less than 0.3, the program exits the routine 306 at block 332 and passes to step 308 of the routine 300. Returning now to step 324, if the operating margin is not greater than 0.3, the program is directed to step 321 in which the main gain is set to its maximum level by adjusting the attenuation of the converter 76. The program then passes to step 327 in which it computes a new operating margin pursuant to routine 200 and queries whether it is less than 0.3. in order to make yet another branching decision. If the operating margin is not less than 0.3 the program is directed to step 326 in which the main gain is decremented by one (counter) step and thereafter jumps back to step 327. If, on the other hand, the operating margin is less than 0.3, the program exits the routine 306 at block 332 and passes to step 308 of the routine 300. The learn background routine 306 lowers the main gain down from its maximum level on a step by step basis until the operating margin is less than 0.3 under background conditions.

Referring now to FIG. 13, the learn target routine 312 begins with the photoelectric unit arranged for viewing the target as indicated by step 340. In step 342 the program computes the operating margin and queries whether the operating margin is greater than 2.0. If the operating margin is greater than 2.0, conditions are satisfactory for detection operations and the program is directed to exit the routine 312 at block 344 and reenter the routine 300 at step 314. If the margin is less than 2.0 the program proceeds to step 346 in which it queries whether the operating margin is less than 0.6. If the operating margin is less than 0.6, the program is directed to block 348 for termination of the routines 300 since a sufficient operating margin cannot be obtained for satisfactory control operations. If, on the other hand the operating margin is not less than 0.6, the program then passes to step 350 in which it queries whether the operating margin is less than 2.0 but greater than 0.6. If the operating margin is not between 0.6 and 2.0, the program is again directed to the exit block 348 since an error has occurred in the calculations associated with the routines 300, 306 and 312. If, on the other hand the operating margin is between 0.6 and 2.0, the program passes to step 352 in which the main gain is increased by one step. Thereafter, in step 354 the programs queries whether the operating margin is equal to 2.0. If the operating margin is not equal to 2.0, the program is directed to step 356 in which it queries whether the main gain is at its maximum level. If the main gain is not at its maximum level, the program jumps back to step 352 whereby the gain is increased by yet another step. If, on the other hand, the main gain has now reached its maximum level, the program yet again passes to the block 348 for termination of the automatic gain setting routine 300. Returning to step 354, if the operating margin is equal to 2.0, the program proceeds to step 360 in which it calculates an ideal gain setting for these conditions in accordance with equation 1 below:

Ideal Sensitivity = (2 * gain1 * gain3)/((2 * gain3) + (off margin * gain1)

Where:
Gain1 = gain needed to get the on margin up to 2.0 during the "learn target" routine
Off margin = minimum off margin measured during the "learn background" routine
Gain3 = gain at which the 0.3 off margin was produced during the "learn background" routine
and adjusts the main gain value by proportionately reducing the digital control input to the converter 76.

The program then exits the routine 312 at block 362 and returns to routine 300 at step 314. The routine 312 provides for the main gain to be optimized in view of target conditions and especially for the main gain to be set at an optimum value for difficult operating conditions when the light/dark differential is small (e.g. the operating margin is between 0.6 and 2.0).

Figure 14:
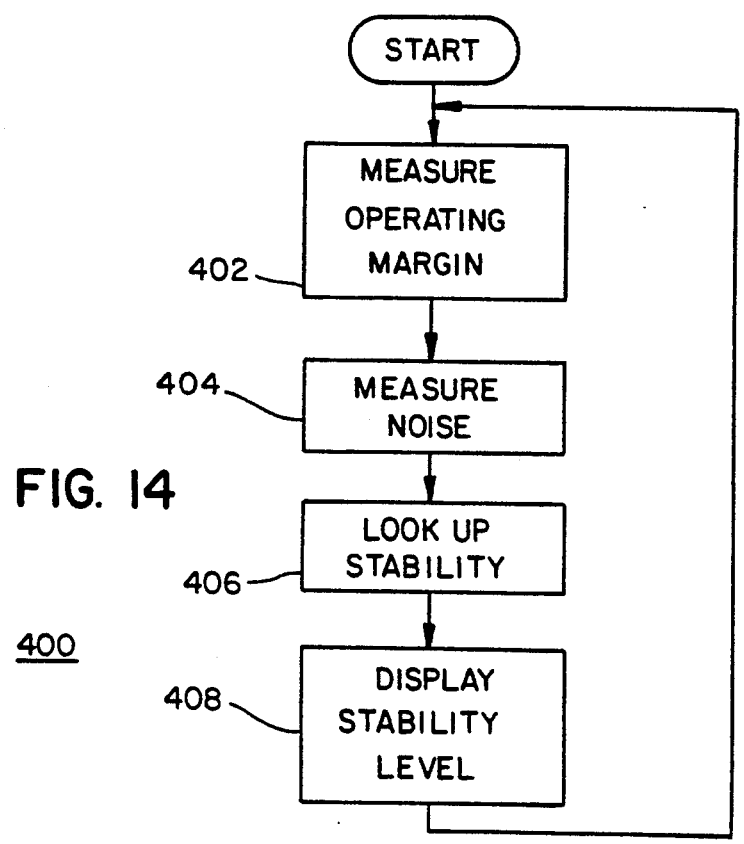
FIG. 14 provides a flow chart of the process for determining an operational stability figure in accordance with the principles of the present invention.

Referring now to FIG. 14, the present invention also provides an indication of photoelectric operational stability based on fuzzy logic techniques through the LED display 26 pursuant to the operation of the routine 400 which runs in the background to provide information about operating conditions affecting the photoelectric control unit 10. In step 402 the program executes the margin routine 200 for determining operating margin. The program then proceeds to step 404 and detects the level of optical or electrical noise by counting the number of noise pulses tripping the detection comparator 90 during interpulse periods (i.e. during intervals when light pulse signals are not being transmitted and return pulses are not being received). The number of noise pulses which activate the comparator 90 during interpulse periods provides a measure of the noise in the environment which is readily obtained by the electronic system 60 without interference with its other operations. The program uses the operating margin and noise level values to reference an operational stability figure using a lookup table in accordance with step 406. In step 408 the program compares the stability figure from the look-up table with a preset threshold (such as 2.0) and provides for the LED 26C to be illuminated if the stability figure is greater than the threshold.

The stability figure lookup table is generated in accordance with well-known fuzzy logic techniques given the membership functions and rules which are described hereinafter. Membership functions for operating margin, noise and stability are defined in accordance with the Fuzzy Logic Function Table below:

| FUZZY LOGIC FUNCTION TABLE | | | | |
|---|---|---|---|---|
| FUNCTION | 0 Start | 1.0 Up | 1.0 Down | 0 Stop |
| margin-lowoff | −1.0 | −1.0 | −0.84 | −0.76 |
| margin-medoff | −0.84 | −0.76 | −0.68 | −0.68 |
| margin-invalid | −0.68 | −0.68 | −0.52 | −0.52 |
| margin-lowon | −0.52 | −0.52 | −0.40 | −0.12 |
| margin-medon | −0.40 | 0.0 | 0.0 | 0.50 |
| margin—medhion | −0.20 | 0.30 | 0.30 | 0.68 |
| margin-hion | 0.52 | 0.68 | 1.0 | 1.0 |
| noise-low | −1.0 | −1.0 | −0.90 | −0.30 |
| noise-med | −1.0 | 0.0 | 0.0 | 0.70 |
| noise-hi | −0.20 | 0.40 | 1.0 | 1.0 |
| stability-low | −1.0 | −1.0 | −0.50 | 0.0 |
| stability-med | −0.50 | 0.0 | 0.0 | 0.50 |
| stability-medhi | 0.0 | 0.40 | 0.40 | 0.70 |
| stability-hi | 0.30 | 0.70 | 1.0 | 1.0 |

Seven membership functions are defined for operating margin while three membership functions are defined for noise and four membership functions are defined for stability. The figures in the fuzzy logic table are normalized from truncated operating ranges of from 0 to 5 in the case of operating margin, from 0 to 15 in the case of noise and from 15 to 109 in the case of stability. The four normalized figures describe a trapezoid (or triangle) which defines the degree of membership of each function. The first column of figures (under 0 start) represents the point at which the membership functions first begin to increase in value from 0 (0% certainty of membership). The second column of figures (under 1.0 up) represent the point at which the membership functions first attain a value of 1.0 after linearly ascending from 0. The third column of figures (under 1.0 down) represents the point at which the membership functions first begin to decrease in value from 1.0. The fourth column of figures (under 0 stop) represents the point at which the membership functions reach 0 value after linearly descending from 1.0. The values of the membership functions are combined in accordance with conventional center of gravity techniques or equivalent in accordance with the rules in the Fuzzy Logic Rule Table below:

| FUZZY LOGIC RULE TABLE | | |
|---|---|---|
| Margin | Noise | Stability |
| invalid | low, med, hi | low |
| lowoff | low | hi |
| lowoff | med | medhi |
| lowoff | hi | low |
| medoff | low | hi |
| medoff | med | med |
| medoff | hi | low |
| lowon | low | med |
| lowon | med, hi | low |
| medon | low | medhi |
| medon | med | med |
| medon | hi | low |

-continued

| FUZZY LOGIC RULE TABLE | | |
| --- | --- | --- |
| Margin | Noise | Stability |
| medhion | low | hi |
| medhion | med | medhi |
| medhion | hi | med |
| hion | low, med | hi |
| hion | hi | medhi |

Figure 15:
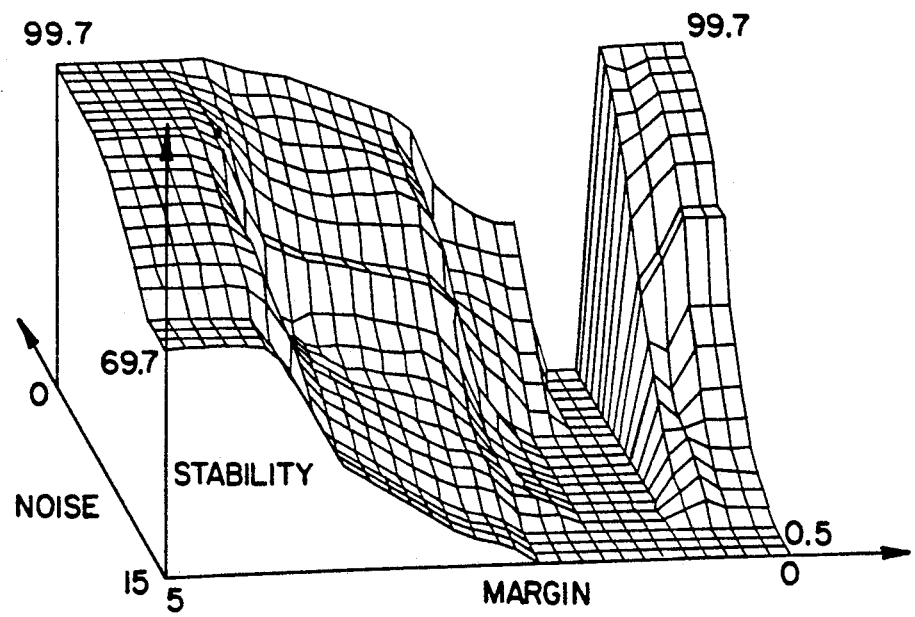
FIG. 15 provides a three-dimensional surface mesh graph showing photoelectric operating stability as a function of operation margin and background noise in accordance with fuzzy logic techniques.

The membership functions and rules determine the entries for the lookup table as illustrated in the three-dimensional graph shown in FIG. 15. The lookup table relates certain discrete values of operating margin and noise to stability figures in accordance with the degree of accuracy desired. These stability figures can then be used in providing visual displays or, alternatively, can be output as an analog signal from the photoelectric control unit 10 so that performance of the unit 10 could be monitored at a remote location.

While particular embodiments of the present invention have been shown and described, it should be clear that changes and modifications may be made to such embodiments without departing from the true scope and spirit of the invention. It is intended that the appended claims cover all such changes and modifications.

We claim:

1. A photoelectric detection system, comprising:
    a microprocessor control unit;
    a light source connected to said control unit for generating light pulses;
    a photodetector arranged for detecting return light pulses originating with said light source and providing a photodetector output signal;
    a first variable-gain amplifier module for amplifying said output signal from said photodetector in accordance with gain settings provided by said control unit to generate a main output signal;
    a second variable-gain amplifier module for amplifying said main output signal from said first variable-gain amplifier module in accordance with gain settings provided by said control unit to generate a margin output signal; and
    comparison means for comparing said main output signal from said first amplifier module and said margin output signal from said second amplifier module with a common reference level in order to generate comparison signals for supply to said control unit in order to allow said control unit to determine operating margin levels based on the gain settings furnished by said control unit to said amplifier modules.

2. The photoelectric detection system of claim 1, wherein said first amplifier module and said second amplifier module each include a fixed gain amplifier and a multiplying digital-to-analog converter operating as an attenuator under the control of said control unit for adjusting gain levels.

3. The photoelectric detection system of claim 1, wherein said microprocessor control unit includes a memory module having a software program resident therein for determining operating margin by manipulating the gain settings of said variable-gain amplifier modules and using said comparison signals to identify resulting output levels.

4. The photoelectric detection system of claim 1, wherein said light source includes a light emitting diode and said photodetector includes a photodiode.

5. A photoelectric detection system, comprising:
    a light source for generating light pulses which are directed across a target range in which target objects may be present or absent;
    a photodetector for detecting return light pulses from said target range and providing a photodetector output signal as a function of the presence or absence of said pulses which is indicative of the presence or absence of target objects in said target range;
    a first amplification channel for amplifying said output signal from said photodetector and comparing this signal to a reference level to generate a pulse detection signal;
    a second variable-gain amplification channel for amplifying said output signal from said photodetector and comparing this signal to a reference level to generate a margin level identification signal; and
    control means for varying the gain of said second channel and tracking said pulse detection and margin level identification signals in order to determine operating margin.

6. The photoelectric detection system of claim 5, further including a main variable-gain module for amplifying said photodetector output signal prior to its supply to said first and second channels and wherein said control means is adapted for varying the gain of said main variable-gain module whereby gain levels on said channels can be throttled down.

7. The photoelectric detection system of claim 5, wherein said second amplification channel includes:
    a first attenuator under control of said control means for varying gain,
    a first fixed gain amplifier,
    a comparator for comparing the output signal from said first fixed gain amplifier with a reference level.

8. The photoelectric detection system of claim 7, wherein said attenuator comprises a multiplying digital-to-analog converter and said control means comprises a microprocessor system operating under software control.

9. In a photoelectric detection system in which light pulses from a light source are periodically transmitted across a target range for synchronous detection by a photodetector in order to produce detection signals which can be amplified by a variable gain amplification module and thereafter used in providing an indication of the presence or absence of target objects in the target range, a method of automatically setting an optimum gain setting for said amplification module comprising the
    generating a first detection signal with said photoelectric system under background conditions;
    decrementing the gain of said amplification module until the operating margin for said system reaches a fixed OFF margin threshold;
    generating a second detection signal with said photoelectric system under target conditions;
    comparing the initial operating margin for said system under target conditions with a fixed ON margin threshold; and
    setting said gain setting to the current gain level of said amplification module if the initial operating margin exceeds said ON margin threshold.

10. The photoelectric detection system of claim 9, further including the steps of:

incrementing the gain of said amplification module until the operating margin for said system reaches said ON margin threshold if the initial operating margin for said system does not exceed said ON margin threshold; and setting said gain setting to an optimum value based on the gain of said amplification system at which said OFF margin threshold is reached and at which said ON margin threshold is reached.

11. The photoelectric detection system of claim 10, wherein said optimum value is calculated in accordance with the equation:

optimum gain setting = (2 * gain1 * gain3)/((2 * gain3) + (off margin * gain1))

Where:

Gain1 = gain needed to get the ON operating margin up to 2.0 under target conditions Off margin = minimum OFF operating margin measured during the under background conditions Gain3 = gain at which the 0.3 OFF operating margin was produced under background conditions 12. The photoelectric detection system of claim 9, wherein said steps of incrementing and decrementing gain are performed by regulating the attenuation provided by one or more multiplying digital-to-analog converters.

* * * * *